(12) United States Patent
Pham et al.

(10) Patent No.: US 8,240,038 B1
(45) Date of Patent: Aug. 14, 2012

(54) METHOD FOR FORMING AN ANTI-TAMPER MESH

(75) Inventors: Cuong V. Pham, San Diego, CA (US); David E. Chubin, Northridge, CA (US); Robert A. Clarke, Thousand Oaks, CA (US); Aaron D. Kuan, Huntington Beach, CA (US)

(73) Assignee: Teledyne Technologies Incorporated, Thousand Oaks, CA (US)

( * ) Notice: Subject to any disclaimer, the term of this patent is extended or adjusted under 35 U.S.C. 154(b) by 143 days.

(21) Appl. No.: 12/653,919

(22) Filed: Dec. 21, 2009

Related U.S. Application Data

(63) Continuation of application No. 11/252,402, filed on Oct. 18, 2005, now Pat. No. 7,640,658.

(51) Int. Cl.
*H05K 3/02* (2006.01)
*H05K 3/10* (2006.01)

(52) U.S. Cl. .................... 29/846; 430/541; 713/194

(58) Field of Classification Search .................. 205/125; 257/679, 784; 340/541, 550, 571, 652; 361/765, 361/818; 428/68; 713/194; 29/592.1, 601.1, 29/842, 846
See application file for complete search history.

(56) References Cited

U.S. PATENT DOCUMENTS

| | | | |
|---|---|---|---|
| 3,725,671 A | 4/1973 | Keister et al. | |
| 3,860,835 A | 1/1975 | Brymer et al. | |
| 4,175,990 A | 11/1979 | Hattori et al. | |
| 4,860,351 A * | 8/1989 | Weingart | 713/194 |
| 4,962,415 A | 10/1990 | Yamamoto et al. | |
| 5,027,397 A | 6/1991 | Double et al. | |
| 5,159,629 A | 10/1992 | Double et al. | |
| 5,233,505 A | 8/1993 | Chang et al. | |
| 5,389,738 A * | 2/1995 | Piosenka et al. | 713/194 |
| 5,503,992 A | 4/1996 | Brodeur et al. | |
| 5,858,500 A | 1/1999 | MacPherson | |
| 5,861,662 A | 1/1999 | Candelore | |
| 6,201,707 B1 | 3/2001 | Sota | |
| 6,524,462 B1 | 2/2003 | Lowe | |
| 6,930,023 B2 | 8/2005 | Okada et al. | |
| 7,256,692 B2 | 8/2007 | Vatsaas et al. | |
| 7,489,013 B1 | 2/2009 | Chubin et al. | |

(Continued)

FOREIGN PATENT DOCUMENTS

DE 10252329 A1 5/2004

OTHER PUBLICATIONS

U.S. Appl. No. 11/043,626, filed Jan. 25, 2005.

(Continued)

*Primary Examiner* — Donghai D. Nguyen
(74) *Attorney, Agent, or Firm* — K&L Gates LLP

(57) ABSTRACT

A method including positioning an electronic device proximate a second device, the electronic device including at least one of a semiconductor device, an integrated circuit chip, and an electronic substrate, and the second device activatable to form a conductive pattern on the electronic device. The method further includes activating the second device to form the conductive pattern and forming the conductive pattern on at least two surfaces of the electronic device. The conductive pattern includes one or more than one conductive trace. Each conductive trace includes a conductive material and is continuous between at least two surfaces of the electronic device. Each conductive trace is formed by controlling relative movement of the electronic device and the second device during activation of the second device.

23 Claims, 4 Drawing Sheets

U.S. PATENT DOCUMENTS

2002/0199111 A1    12/2002    Clark et al.
2004/0244889 A1    12/2004    Sailor et al.

OTHER PUBLICATIONS

Office Action issued on Mar. 5, 2007 in U.S. Appl. No. 11/043,626.
Office Action issued on Jun. 26, 2007 in U.S. Appl. No. 11/043,626.
Office Action issued on Mar. 11, 2008 in U.S. Appl. No. 11/043,626.
Office Action issued on Jan. 7, 2009 in U.S. Appl. No. 11/043,626.
Office Action issued on Nov. 10, 2009 in U.S. Appl. No. 11/043,626.
Notice of Allowance and Fee(s) Due issued on Dec. 9, 2009 in U.S. Appl. No. 11/043,626.
U.S. Appl. No. 11/252,402, filed Oct. 18, 2005.
Office Action issued on Oct. 9, 2007 in U.S. Appl. No. 11/252,402.
Office Action issued on Mar. 27, 2008 in U.S. Appl. No. 11/252,402.
Office Action issued on Nov. 7, 2008 in U.S. Appl. No. 11/252,402.
Notice of Allowance and Fee(s) Due issued on Jun. 25, 2009 in U.S. Appl. No. 11/252,402.
Supplemental Notice of Allowability issued on Aug. 6, 2009 in U.S. Appl. No. 11/252,402.
Office Action issued on Oct. 13, 2006 in U.S. Appl. No. 11/252,403.
Office Action issued on Feb. 20, 2007 in U.S. Appl. No. 11/252,403.
Office Action issued on Oct. 18, 2007 in U.S. Appl. No. 11/252,403.
Office Action issued on Apr. 16, 2008 in U.S. Appl. No. 11/252,403.
U.S. Appl. No. 11/944,771, filed Nov. 26, 2007.
U.S. Appl. No. 12/368,256, filed Feb. 9, 2009.
U.S. Appl. No. 12/564,487, filed Sep. 22, 2009.
D3 Tamper Respondent Systems Product Brochure, 2001, 6 pages.
D3 Technology Tamper Respondent Sensors and Enclosures, W.L. Gore & Associates (UK) Ltd. Dundee Technology Park, Dundee DD2 1JA, Scotland, 2 pages.
Pyrofuze®, Sigmund Cohn Corp., Mount Vernon, New York, printed from http://www.sigmundcohn.com/pyrofuse.html, 2 pages.
Notice of Allowance and Fees Due issued on Sep. 29, 2010 in U.S. Appl. No. 12/368,256.
Non-Final Rejection mailed on Apr. 16, 2008 in U.S. Appl. No. 11/252,403.
Notice of Allowance and Fees Due issued on Oct. 3, 2008 in U.S. Appl. No. 11/252,403.
Non-Final Rejection mailed on Jun. 9, 2010 in U.S. Appl. No. 11/944,771.
Final Rejection mailed on Nov. 23, 2010 in U.S. Appl. No. 11/944,771.
Notice of Allowance and Fees Due issued on Feb. 3, 2011 in U.S. Appl. No. 11/944,771.

* cited by examiner

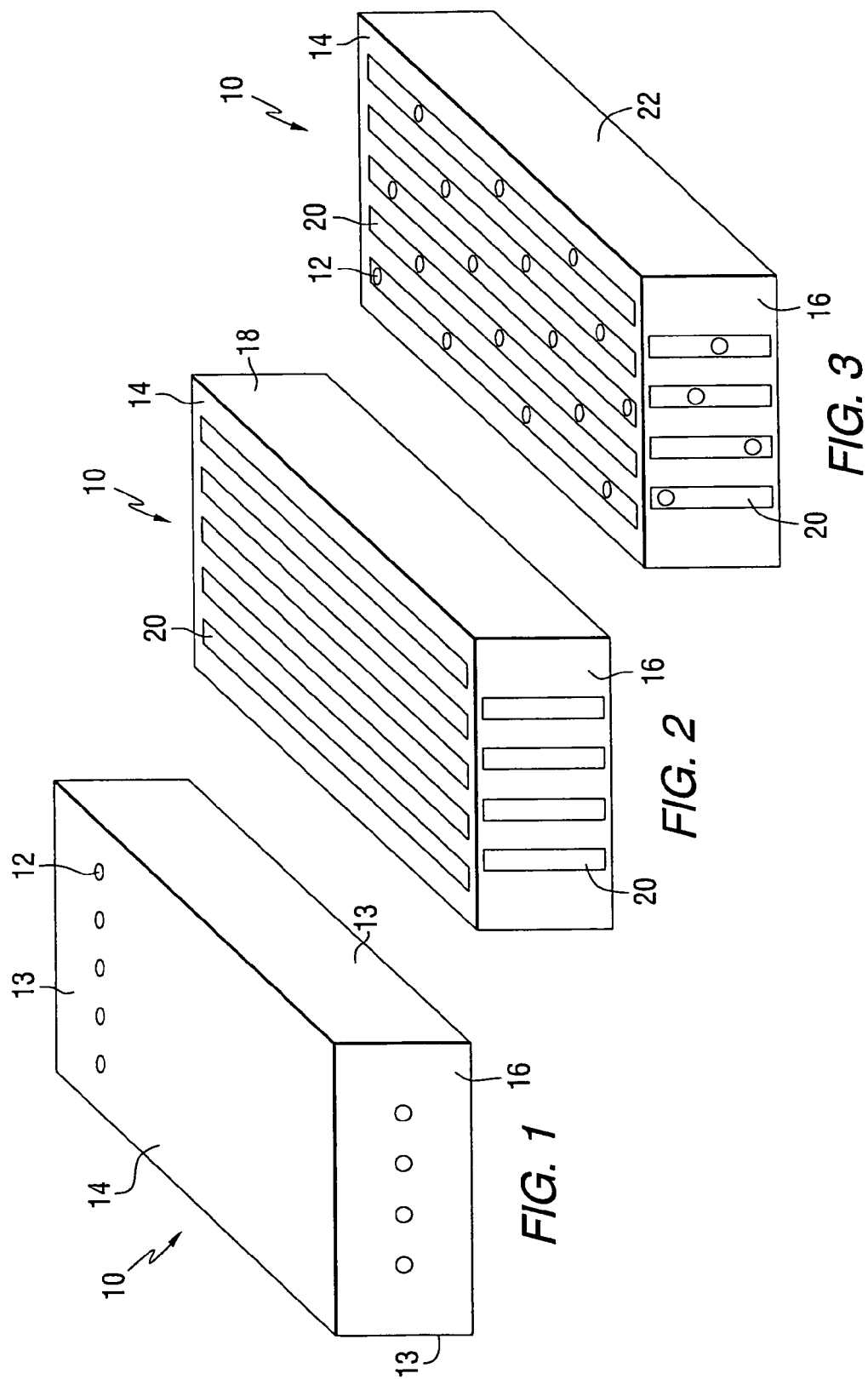

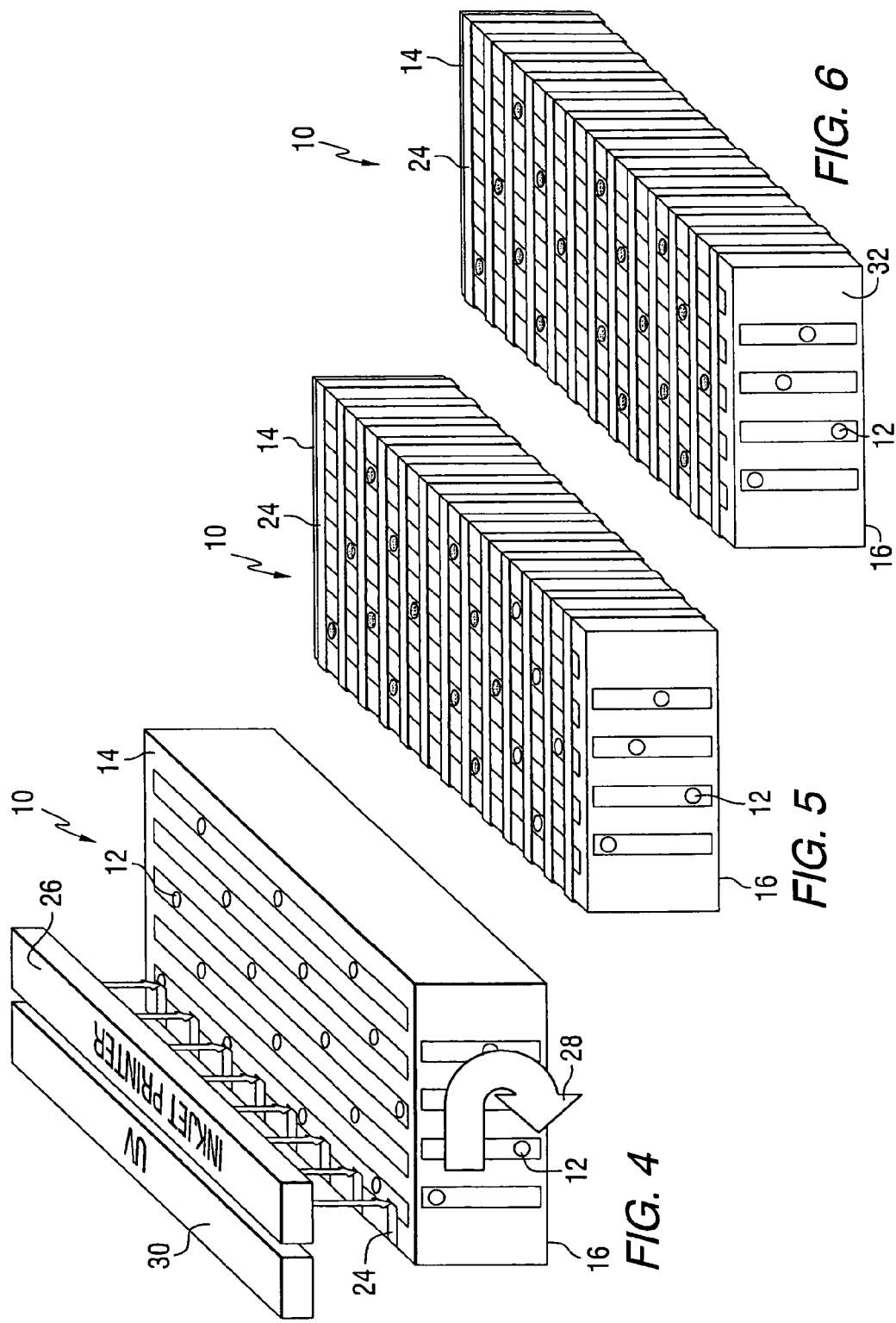

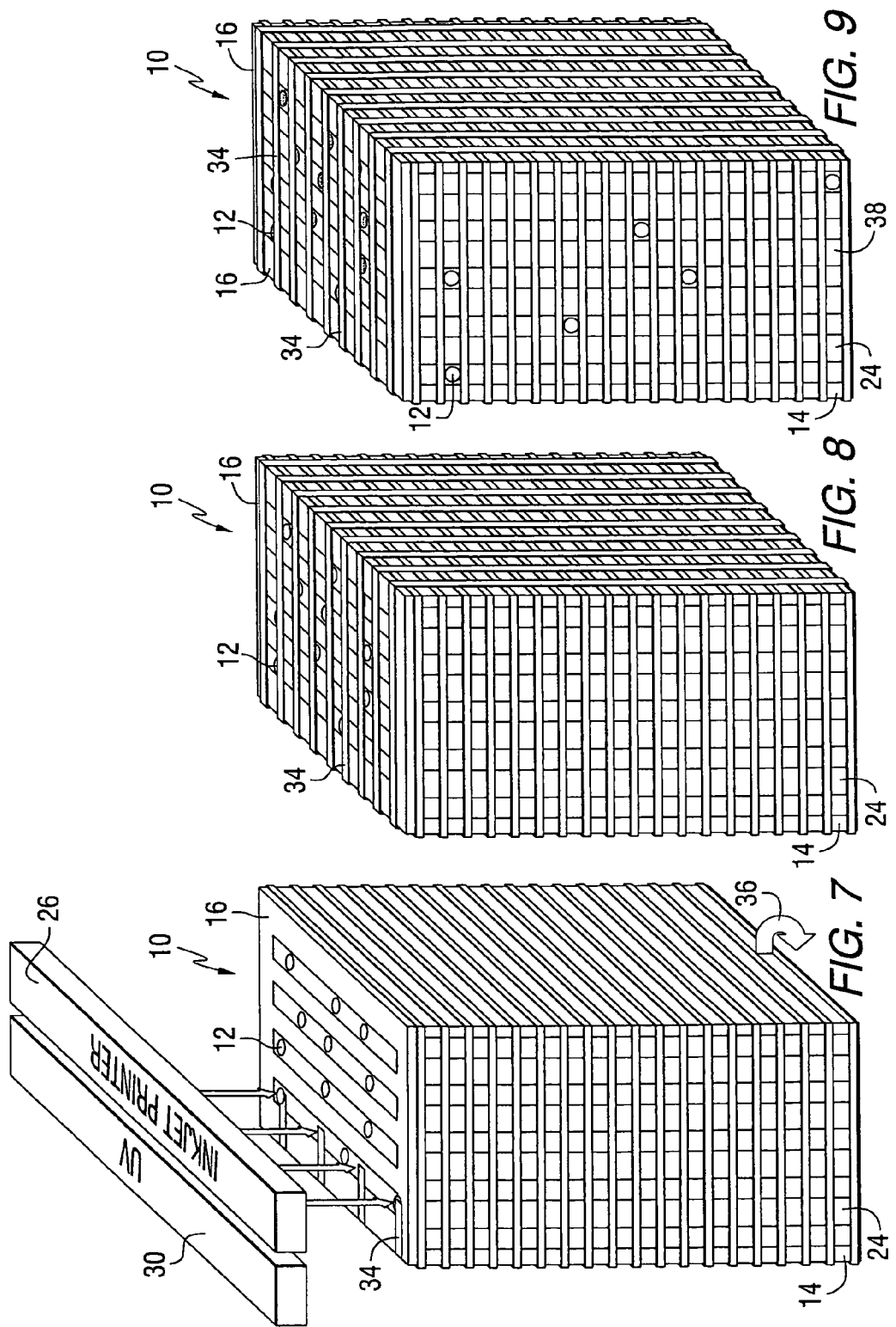

METHOD FOR FORMING AN ANTI-TAMPER MESH

CROSS-REFERENCE TO RELATED APPLICATION

This application is a continuation application of prior application Ser. No. 11/252,402 filed Oct. 18, 2005 now U.S. Pat. No. 7,640,658.

BACKGROUND

Anti-tamper ("AT") protection is employed so that it is very difficult to reverse engineer or alter the function of electronic hardware (e.g., computer processors, integrated circuits, multi-chip modules, etc). For some commercial applications, designers often spend vast sums of money to develop a "next generation" circuit. These companies often wish to deter, or at least hamper a competitor's reverse engineering efforts. The motivation in this case is to protect valuable intellectual property. Military and Government users also have a strong interest in AT protection. When new military hardware is fielded, often the consequences of capture are not fully understood by the designer of the hardware. Similarly, the combat loss of any one of a thousand pieces of sensitive, high-tech military hardware could do irreparable damage to national security.

Most AT is categorized as either passive or active. In each case, the intent is to delay, prevent or stop tampering and potential reverse engineering of an electronic circuit. Passive AT is currently the most widespread method of deterring an opponent from reverse engineering or spoofing an electronic circuit. Current passive AT arrangements include encapsulation or various types of conformal coatings such as epoxies. Methods to defeat common encapsulants are well documented.

AT standards have been defined according to the Federal Information Protection Standard (FIPS) 140-2. The standard describes the requirements for four levels of protection. For the standards for multi-chip, embedded modules, Level 1 calls for standard passivation techniques (i.e., a sealing coat applied over the chip circuitry to protect it against environmental or other physical damage). The standard describes that Level 2 can be achieved using anti-tamper coatings or passive AT. Level 3 may use passive AT if tampering will likely destroy the module. Level 4 requires the use of active AT technologies.

Layered anti-tamper arrangements are also employed in which alternating layers of passive AT with active AT yields a synergy in probing difficulty. With active AT methods, a protected circuit will take some action when unauthorized activities are detected. Any number of events can trigger a programmed circuit response. Examples of active triggering arrangements include: voltage, photon detection, acceleration, strain, thermal, chemical attack, and proximity or tamper-respondent enclosures. A tamper-respondent package can theoretically detect probing by proximity detection or by an external activity mutilating an active circuit, exterior to what is being protected. The response of an active AT circuit upon triggering is also widely variable. For example, zeroization may be employed in which critical memory cells or an entire die can be erased. Similarly, a response can trigger overwriting of some or all of a memory die. Another detection response is to physically obliterate a critical circuit element or elements.

SUMMARY

In one embodiment, the present application is directed a method including positioning an electronic device proximate a second device, the electronic device including at least one of a semiconductor device, an integrated circuit chip, and an electronic substrate, and the second device activatable to form a conductive pattern on the electronic device. The method further includes activating the second device to form the conductive pattern and forming the conductive pattern on at least two surfaces of the electronic device. The conductive pattern includes one or more than one conductive trace. Each conductive trace includes a conductive material and is continuous between at least two surfaces of the electronic device. Each conductive trace is formed by controlling relative movement of the electronic device and the second device during activation of the second device.

In another embodiment, the present application is directed to a method including positioning an electronic device proximate a second device, the electronic device including at least one of a semiconductor device, an integrated circuit chip, and an electronic substrate, and the second device activatable to form a conductive pattern on the electronic device. The method further includes activating the second device to form the conductive pattern and forming the conductive pattern on at least two surfaces of the electronic device. The conductive pattern includes a first plurality of conductive traces and a second plurality of conductive traces. Each conductive trace includes a conductive material and is continuous between at least two surfaces of the electronic device. Each conductive trace is formed by controlling relative movement of the electronic device and the second device during activation of the second device. The method of this embodiment also includes, prior to forming the first plurality of conductive traces, masking a plurality of conductive terminals on the electronic device, coating the electronic device with a second insulation layer and unmasking the plurality of conductive terminals. In this embodiment, the plurality of conductive terminals is located on one or more than one surface of the electronic device.

In another embodiment, the present application is directed to a method including forming a first plurality of conductive loops on an electronic device, with each of the first plurality of conductive loops continuous and surrounding the electronic device in a first direction. The method further includes forming a second plurality of conductive loops on the electronic device, each of the second plurality of conductive loops continuous and surrounding the electronic device in a second direction. In this embodiment, the second plurality of conductive loops is formed after forming the first plurality of conductive loops.

In another embodiment, the present application is directed to a method including forming a first plurality of conductive loops on an electronic device, with each of the first plurality of conductive loops continuous and surrounding the electronic device in a first direction. The method further includes forming a second plurality of conductive loops on the electronic device, each of the second plurality of conductive loops continuous and surrounding the electronic device in a second direction. In this embodiment, the second plurality of conductive loops is formed after forming the first plurality of conductive loops. The method also includes, prior to forming the first plurality of conductive loops, masking a plurality of conductive terminals on the electronic device, coating the electronic device with a second insulation layer, and unmasking the plurality of conductive terminals. In this embodiment, the plurality of conductive terminals is located on one or more than one surface of the electronic device.

In another embodiment, the present application is directed to a method including positioning an electronic device proximate a second device, the electronic device including at least one of a semiconductor device, an integrated circuit chip, and an electronic substrate, and the second device activatable to form a conductive pattern on the electronic device. The method further includes activating the second device to form the conductive pattern and forming the conductive pattern on at least one surface the electronic device. Forming the conductive pattern includes forming a first plurality of conductive traces in a first direction by controlling relative movement of the electronic device and the second device during activation of the second device. Forming the conductive pattern also includes forming a second plurality of conductive traces in a second direction by controlling relative movement of the electronic device and the second device during activation of the second device. The second plurality of conductive traces is formed over the first plurality of conductive traces after forming the first plurality of conductive traces. The first direction is different than the second direction.

BRIEF DESCRIPTION OF THE FIGURES

FIGS. 1 through 11 illustrate an embodiment of a process for fabricating an anti-tampering mesh on an electronic device.

DESCRIPTION

Figure 11:
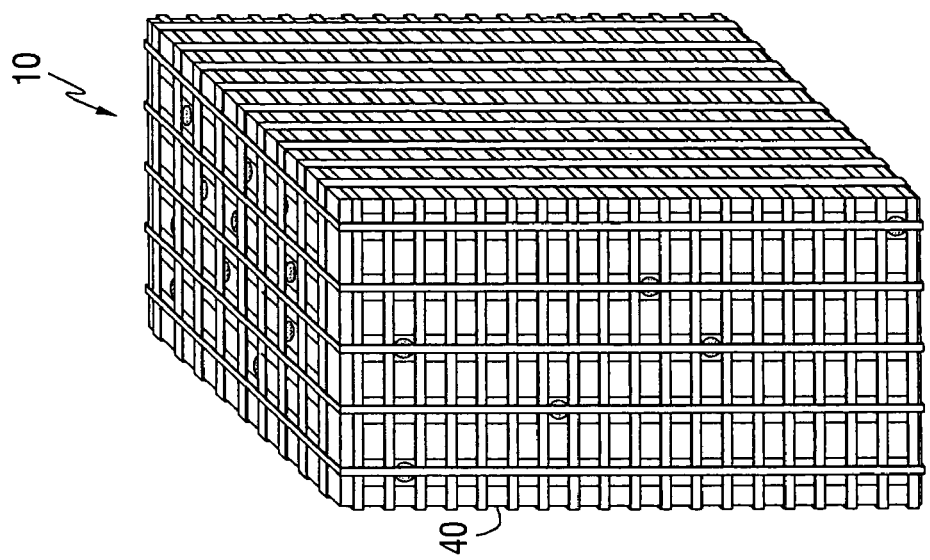

Various embodiments of the present application include an electronic device that has an anti-tampering mesh that is fabricated on the device. In various embodiments, the conductive mesh is defined by single or multiple conductive layers separated by alternating non-conductive (or dielectric) layers. The multiple conductive layers are electrically connected to the detection circuitry with the terminals by electrical vias extending through the dielectric layers. As used herein, the term "electronic device" can include, for example, any type of device or package such as a semiconductor device, an electronic package, an integrated circuit chip, device or module, an electronic or electrical substrate, a circuit board, a packaged circuit, a computer, and the like.

FIGS. 1 through 11 illustrate an embodiment of a process for fabricating an anti-tampering mesh on an electronic device 10. In FIG. 1, terminals 12 are created on a first dielectric layer 13, which covers all surfaces of the electronic device 10. The terminals 12 facilitate an electrical connection from the circuits (not shown) that are contained on or in the device 10 to an anti-tampering mesh that is fabricated on the device 10 as described hereinbelow. In FIG. 2, the terminals 12 are masked and the device 10 is coated with a first insulator layer 18. Conductive traces 20 are then developed on surfaces 14, 16 to facilitate an electrical connection from the circuits (not shown) that are contained on or in the device 10 to an anti-tampering mesh that is fabricated on the device 10 as described herein.

In FIG. 3, the terminals 12 are masked and the device 10 is coated with a second insulator layer 22. The masks are then removed. In FIG. 4, conductive patterns 24 such as, for example, conductive polymer patterns, are deposited using, for example, an inkjet printer 26. The inkjet printer 26 may be, for example, a step-repeat inkjet type of thick film printer or rotary head printer. The device 10 may be rotated in, for example, the direction of the arrow 28 so that four sides of the device 10 may have conductive patterns 24 deposited thereon. The conductive patterns 24 are cured by, for example, a UV light source 30. The UV light source 30 may be attached to the inkjet printer 26 such that the conductive patterns 24 are cured upon deposition by the inkjet printer 26. The resulting device 10 is shown in FIG. 5.

In FIG. 6, the terminals 12 are masked and the device 10 is coated with a third insulator layer 32. The masks are then removed. In FIG. 7, the device 10 is rotated ninety degrees and conductive patterns 34, such as conductive polymer patterns, are deposited using, for example, the inkjet printer 30. The device 10 may be rotated in, for example, the direction of the arrow 36 so that four sides of the device 10 have conductive patterns 34 deposited thereon. The conductive patterns 34 may be cured by, for example, the UV light source 30. The light source 30 may be attached to the inkjet printer 26 such that the conductive patterns 34 are cured upon deposition by the inkjet printer 26. The resulting device 10 is shown in FIG. 8.

Figure 10:
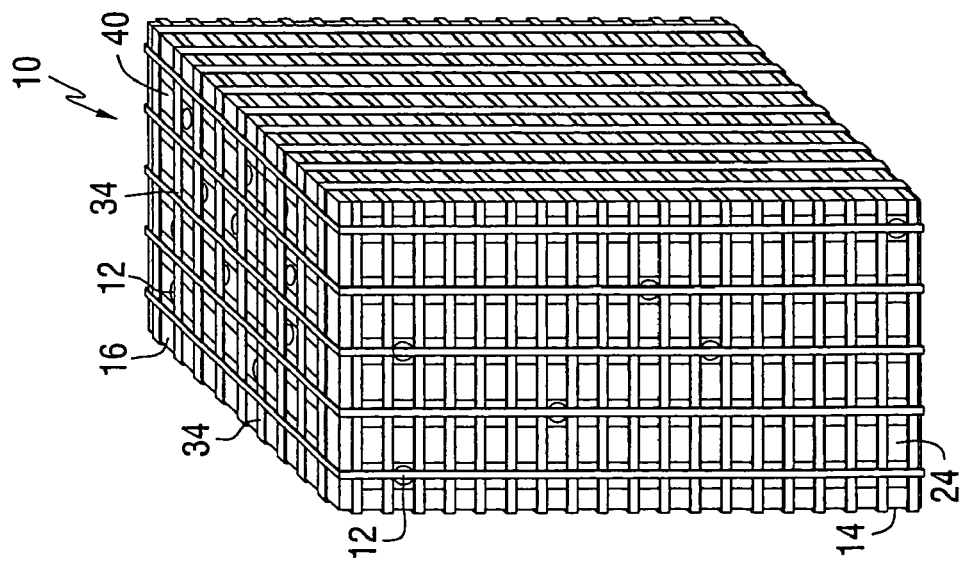

In FIG. 9, the terminals 12 are masked and the device 10 is coated with a fourth insulator layer 38. The masks are then removed. In FIG. 10, device 10 is rotated ninety degrees and conductive patterns 40, such as conductive polymer patterns, are deposited using, for example, the inkjet printer 30. The device 10 may be rotated such that four sides of the device 10 may have conductive patterns 40 deposited thereon. The conductive patterns 40 may be cured by, for example, the UV light source 30. The light source 30 may be attached to the inkjet printer 26 such that the conductive patterns 40 are cured upon deposition by the inkjet printer 26. In FIG. 11, the terminals 12 are masked and the device 10 is coated with a fifth insulator layer 42. The masks are then removed.

Various embodiments of the present application may include conductive materials for the various conductor patterns such as, for example, UV curable conductive polymers such as Ablelux HGA-3A, photo-imagable conductive polymers, heat cured conductive polymers, Papinol's polyaniline based inks, and/or silver, gold, aluminum, or Pd/Pt evaporated coatings. Various embodiments of the present application may include dielectric materials such as, for example, photo-imagable photoresist such as Cyclotene (BCB) 4024-40, UV curable materials such as Dupont BQ411, UV solder masks such as Lite Fast SR-1000, and/or elastomeric dielectric materials.

It can be understood that various techniques may be employed to construct a mesh on an electronic device without departing from the teachings of the present application. For example, the mesh may be constructed using various techniques that employ UV conductive polymers, and/or photo-imageable conductor polymers, evaporated coatings (thermal spray) of metals using, for example, e-beam technology or thermal or magnetron (sputtering) in conjunction with masks. The conductive traces can also be dispensed by depositing metal-filled or carbon-filled epoxies or other filled or otherwise conductive polymers by various syringe dispensing, screen printing and like methods. Also, it can be understood that the terminals 12 may be located randomly on any number of surfaces of the device 10. Furthermore, it can be understood that the conductive traces may be formed in any suitable shape or pattern and be arranged in any suitable orientation. It can also be understood that the dielectric (non-conductive) layers can be dispensed by various printing, syringe dispensing, coating, or fluid dispensing methods. Numerous such methods should be obvious to one of average skill in the art.

The techniques and structures of the various embodiments of the present application may be used to detect tampering of an electronic device. In operation and according to various embodiments of the present application, a resistance value of a mesh that is located on the device may be known after the mesh is formed on the device. The resistance may be monitored by, for example, a circuit located in the device and, if one or more of the lines of the mesh is broken or disrupted, a change in resistance can be detected by the circuit. Such a circuit may be, for example, a wheatstone bridge circuit. The mesh circuitry may also be monitored for changes in the capacitance of the network. In this case, it may also be possible to use the system of conducting mesh and dielectrics as a proximity detector.

It is to be understood that the figures and descriptions of embodiments of the present application have been simplified to illustrate elements that are relevant for a clear understanding of the present application, while eliminating, for purposes of clarity, other elements. Those of ordinary skill in the art will recognize, however, that these and other elements may be desirable for practice of various aspects of the present embodiments. However, because such elements are well known in the art, and because they do not facilitate a better understanding of the present application, a discussion of such elements is not provided herein.

It can be appreciated that, in some embodiments of the present methods and systems disclosed herein, a single component can be replaced by multiple components, and multiple components replaced by a single component, to perform a given function or functions. Except where such substitution would not be operative to practice the present methods and systems, such substitution is within the scope of the present application.

Examples presented herein, including operational examples, are intended to illustrate potential implementations of the present method and system embodiments. It can be appreciated that such examples are intended primarily for purposes of illustration. No particular aspect or aspects of the example method, product, and/or system embodiments described herein are intended to limit the scope of the present application.

It should be appreciated that figures presented herein are intended for illustrative purposes and are not intended as construction drawings. Omitted details and modifications or alternative embodiments are within the purview of persons of ordinary skill in the art. Furthermore, whereas particular embodiments have been described herein for the purpose of illustrating the invention and not for the purpose of limiting the same, it will be appreciated by those of ordinary skill in the art that numerous variations of the details, materials and arrangement of parts/elements/steps/functions may be made within the principle and scope of the invention without departing from the invention as described in the appended claims.

What is claimed is:

1. A method, comprising:
    positioning an electronic device proximate a second device, the electronic device comprising at least one of a semiconductor device, an integrated circuit chip, and an electronic substrate, the second device activatable to form a conductive pattern on the electronic device;
    activating the second device to form the conductive pattern; and
    forming the conductive pattern on at least two surfaces of the electronic device, the conductive pattern comprising one or more than one conductive trace, each of the one or more than one conductive trace comprising a conductive material and being continuous between at least two surfaces of the electronic device, the one or more than one conductive trace formed by controlling relative movement of the electronic device and the second device during activation of the second device;
    wherein forming the conductive pattern comprises:
    forming a first plurality of conductive traces in a first direction; and
    forming a second plurality of conductive traces in a second direction.

2. The method of claim 1, wherein activating the second device to form the conductive pattern comprises activating the second device to deposit the conductive pattern onto the electronic device.

3. The method of claim 1, wherein activating the second device to form the conductive pattern comprises activating the second device to photo-image the conductive pattern on the electronic device.

4. The method of claim 1, comprising:
    forming the first plurality of conductive traces simultaneously; and
    forming the second plurality of conductive traces simultaneously after forming the first plurality of conductive traces.

5. The method of claim 1, wherein forming the conductive pattern comprises electrically connecting the conductive pattern to an electrical detection circuit of the electronic device, the electrical detection circuit to detect a change in an electrical characteristic of the conductive pattern.

6. The method of claim 1, wherein controlling relative movement of the electronic device and the second device includes rotating the electronic device relative to the second device.

7. The method of claim 1, wherein controlling relative movement of the electronic device and the second device includes rotating the second device relative to the electronic device.

8. The method of claim 1, wherein the second device comprises an inkjet printer.

9. The method of claim 1, wherein the second device comprises a device for applying an evaporated coating of metal.

10. The method of claim 1, wherein the second device comprises a sputtering device.

11. The method of claim 1, wherein the second device comprises a screen printing device.

12. The method of claim 1, wherein the second device comprises a syringe dispensing device.

13. A method, comprising:
    positioning an electronic device proximate a second device, the electronic device comprising at least one of a semiconductor device, an integrated circuit chip, and an electronic substrate, the second device activatable to form a conductive pattern on the electronic device;
    activating the second device to form the conductive pattern; and
    forming the conductive pattern on at least two surfaces of the electronic device, the conductive pattern comprising one or more than one conductive trace, each of the one or more than one conductive trace comprising a conductive material and being continuous between at least two surfaces of the electronic device, the one or more than one conductive trace formed by controlling relative movement of the electronic device and the second device during activation of the second device;
    wherein forming the conductive pattern comprises:
    forming a first plurality of conductive traces simultaneously; and
    forming a second plurality of conductive traces simultaneously after forming the first plurality of conductive traces.

14. The method of claim 13, wherein activating the second device to form the conductive pattern comprises activating the second device to deposit the conductive pattern onto the electronic device.

15. The method of claim 13, wherein activating the second device to form the conductive pattern comprises activating the second device to photo-image the conductive pattern on the electronic device.

16. The method of claim 13, wherein forming the conductive pattern comprises electrically connecting the conductive pattern to an electrical detection circuit of the electronic device, the electrical detection circuit to detect a change in an electrical characteristic of the conductive pattern.

17. The method of claim 13, wherein controlling relative movement of the electronic device and the second device includes rotating the electronic device relative to the second device.

18. The method of claim 13, wherein controlling relative movement of the electronic device and the second device includes rotating the second device relative to the electronic device.

19. The method of claim 13, wherein the second device comprises an inkjet printer.

20. The method of claim 13, wherein the second device comprises a device for applying an evaporated coating of metal.

21. The method of claim 13, wherein the second device comprises a sputtering device.

22. The method of claim 13, wherein the second device comprises a screen printing device.

23. The method of claim 13, wherein the second device comprises a syringe dispensing device.

\* \* \* \* \*